(12) United States Patent
Kim et al.

(10) Patent No.: US 9,431,129 B2
(45) Date of Patent: Aug. 30, 2016

(54) VARIABLE READ DELAY SYSTEM

(71) Applicant: QUALCOMM Incorporated, San Diego, CA (US)

(72) Inventors: Jung Pill Kim, San Diego, CA (US); Taehyun Kim, San Diego, CA (US); Sungryul Kim, San Diego, CA (US); Xiangyu Dong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 98 days.

(21) Appl. No.: 14/266,326

(22) Filed: Apr. 30, 2014

(65) Prior Publication Data

US 2015/0318057 A1  Nov. 5, 2015

(51) Int. Cl.

| | |
|---|---|
| *G11C 29/02* | (2006.01) |
| *G11C 29/30* | (2006.01) |
| *G11C 7/10* | (2006.01) |
| *G11C 16/26* | (2006.01) |
| *G11C 16/30* | (2006.01) |
| *G11C 14/00* | (2006.01) |
| *G06F 11/10* | (2006.01) |

(Continued)

(52) U.S. Cl.
CPC .......... *G11C 29/026* (2013.01); *G06F 11/106* (2013.01); *G06F 11/1072* (2013.01); *G06F 11/1076* (2013.01); *G11C 7/06* (2013.01); *G11C 7/08* (2013.01); *G11C 7/1072* (2013.01); *G11C 14/009* (2013.01); *G11C 14/0081* (2013.01); *G11C 16/26* (2013.01); *G11C 16/30* (2013.01); *G11C 29/30* (2013.01); *G11C 29/52* (2013.01); *G11C 7/1006* (2013.01); *G11C 11/16* (2013.01); *G11C 13/004* (2013.01); *G11C 2029/0411* (2013.01)

(58) Field of Classification Search
CPC .......... G11C 7/08; G11C 7/12; G11C 11/419; G11C 11/41; G11C 29/50; G11C 29/12015; G11C 7/22; G11C 7/062; G11C 7/067; G11C 29/02; G11C 2029/1204; G11C 29/026; G11C 29/023; G11C 29/30; G11C 29/52; G11C 16/30; G11C 14/0081; G11C 14/009; G11C 7/1072; G11C 2029/0411; G11C 11/16; G11C 13/004; G11C 7/1006; G11C 7/06; G06F 11/1072; G06F 11/1076; G06F 11/106
See application file for complete search history.

(56) References Cited

U.S. PATENT DOCUMENTS

| | | | | |
|---|---|---|---|---|
| 5,497,347 A | * | 3/1996 | Feng ................... | G06F 12/0895 365/189.02 |
| 7,177,207 B1 | * | 2/2007 | Vernenker ................ | G11C 7/08 326/39 |

(Continued)

OTHER PUBLICATIONS

International Search Report and Written Opinion—PCT/US2015/021804—ISA/EPO—Jun. 18, 2015.

*Primary Examiner* — Albert Decady
*Assistant Examiner* — Kyle Vallecillo
(74) *Attorney, Agent, or Firm* — Toler Law Group, PC (57) ABSTRACT

A device includes a plurality of memory cells of a memory array, a sense amplifier of the memory array, and selection logic of the memory array. The sense amplifier is configured to sense at least one data value from at least one memory cell of the plurality of memory cells. The selection logic is configured to select between causing the sense amplifier to sense the at least one data value using a first sensing delay and causing the sense amplifier to sense the at least one data value using a second sensing delay. The second sensing delay is longer than the first sensing delay.

30 Claims, 7 Drawing Sheets

(51) Int. Cl.
  *G11C 29/52* (2006.01)
  *G11C 7/06* (2006.01)
  *G11C 7/08* (2006.01)
  G11C 29/04 (2006.01)
  G11C 11/16 (2006.01)
  G11C 13/00 (2006.01)

(56) References Cited

U.S. PATENT DOCUMENTS

| | | |
|---|---|---|
| 8,161,331 B2 | 4/2012 | Bae et al. |
| 8,489,936 B2 | 7/2013 | Gower et al. |
| 8,495,330 B2 | 7/2013 | Vergis et al. |
| 8,639,865 B2 | 1/2014 | Grunzke |
| 2002/0147883 A1* | 10/2002 | Hsu .............. G06F 12/0846 711/105 |
| 2008/0084781 A1 | 4/2008 | Piorkowski |
| 2010/0023839 A1 | 1/2010 | Uneme |
| 2013/0265836 A1 | 10/2013 | Seningen et al. |
| 2014/0059398 A1* | 2/2014 | Cunningham ...... G06F 11/1048 714/721 |

* cited by examiner

VARIABLE READ DELAY SYSTEM

I. FIELD

The present disclosure is generally related to a variable read delay system.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

A computing device may include a memory (e.g., random access memory (RAM)) used to store data. The memory may include memory cells as storage elements. Data errors may occur at the memory, causing data read from the memory to differ from data written to the memory. A data error may be caused by performing a read operation too quickly (e.g., before an output of a sense amplifier connected to a memory cell has time to settle). Outputs corresponding to the memory cells of the memory may take different amounts of time to settle. For example, an output corresponding to a first memory cell of the memory may take longer to settle, as compared to an output corresponding to a second memory cell of the memory. One method to reduce an error rate associated with performing a read operation too quickly is to wait an amount of time equal to a time needed by an output corresponding to the slowest memory cell of the memory to settle (e.g., a worst case read time). However, other memory cells of the memory may be read more quickly than the worst case read time. Thus, many read operations at the memory may be unnecessarily slow when the worst case read time is used.

III. SUMMARY

This disclosure presents embodiments of a variable read delay system. Responsive to a read operation request to access at least one data value from at least one memory cell of a memory array, a memory controller of the variable read delay system may select between a first sensing delay (e.g., 4.2 nanoseconds (ns)) and a second sensing delay (e.g., 8.5 ns). The memory controller may select between the first sensing delay and the second sensing delay based on a default sensing delay or based on a read delay value. For example, responsive to the read operation request, the memory controller may select the first sensing delay, and the memory controller may select the second sensing delay responsive to receiving an indication of an uncorrectable error correction code (ECC) error. As another example, the memory controller may receive (e.g., from an external memory device or from a memory device of the memory controller) a read delay value, and the memory controller may select between the first sensing delay and the second sensing delay based on the read delay value. The memory controller may send a selection signal to selection logic coupled to a sense amplifier. The selection logic may send one or more signals to the sense amplifier to cause the sense amplifier to sense the at least one data value using the selected sensing delay (e.g., the first sensing delay or the second sensing delay). The variable read delay system may decrease an average read time at the memory array without increasing an output error rate (e.g., an error rate associated with data provided to a requesting device responsive to a read operation request).

In a particular embodiment, an apparatus includes a plurality of memory cells of a memory array, a sense amplifier of the memory array, and selection logic of the memory array. The sense amplifier is configured to sense at least one data value from at least one memory cell of the plurality of memory cells. The selection logic is configured to select between causing the sense amplifier to sense the at least one data value using a first sensing delay and causing the sense amplifier to sense the at least one data value using a second sensing delay. The second sensing delay is longer than the first sensing delay.

In another particular embodiment, a method includes selecting, in response to a read operation request, a particular sensing delay from a first sensing delay and a second sensing delay. The second sensing delay is longer than the first sensing delay. The method further includes sending a signal to a sense amplifier to cause the sense amplifier to sense at least one data value corresponding to the read operation request using the particular sensing delay.

In another particular embodiment, an apparatus includes means for storing data. The apparatus further includes means for sensing at least one data value from the means for storing data. The apparatus further includes means for selecting between causing the means for sensing at least one data value to sense the at least one data value using a first sensing delay and causing the means for sensing at least one data value to sense the at least one data value using a second sensing delay. The second sensing delay is longer than the first sensing delay.

In another particular embodiment, a non-transitory computer readable medium stores instructions that, when executed by a processor, cause the processor to initiate selecting, in response to a read operation request, a particular sensing delay from a first sensing delay and a second sensing delay. The second sensing delay is longer than the first sensing delay. The non-transitory computer readable medium further stores instructions that, when executed by the processor, cause the processor to initiate sending a signal to a sense amplifier to cause the sense amplifier to sense at least one data value corresponding to the read operation request using the particular sensing delay.

One particular advantage provided by at least one of the disclosed embodiments is an electronic device that includes a variable read delay system may have a lower average memory read time, as compared to an electronic device that does not include the variable read delay system. The electronic device that includes the variable read delay system may have a similar output error rate (e.g., an error rate associated with data provided to a requesting device) as the electronic device that does not include the variable read delay system.

Other aspects, advantages, and features of the present disclosure will become apparent after review of the entire application, including the following sections: Brief Description of the Drawings, Detailed Description, and the Claims.

V. DETAILED DESCRIPTION

Figure 1:
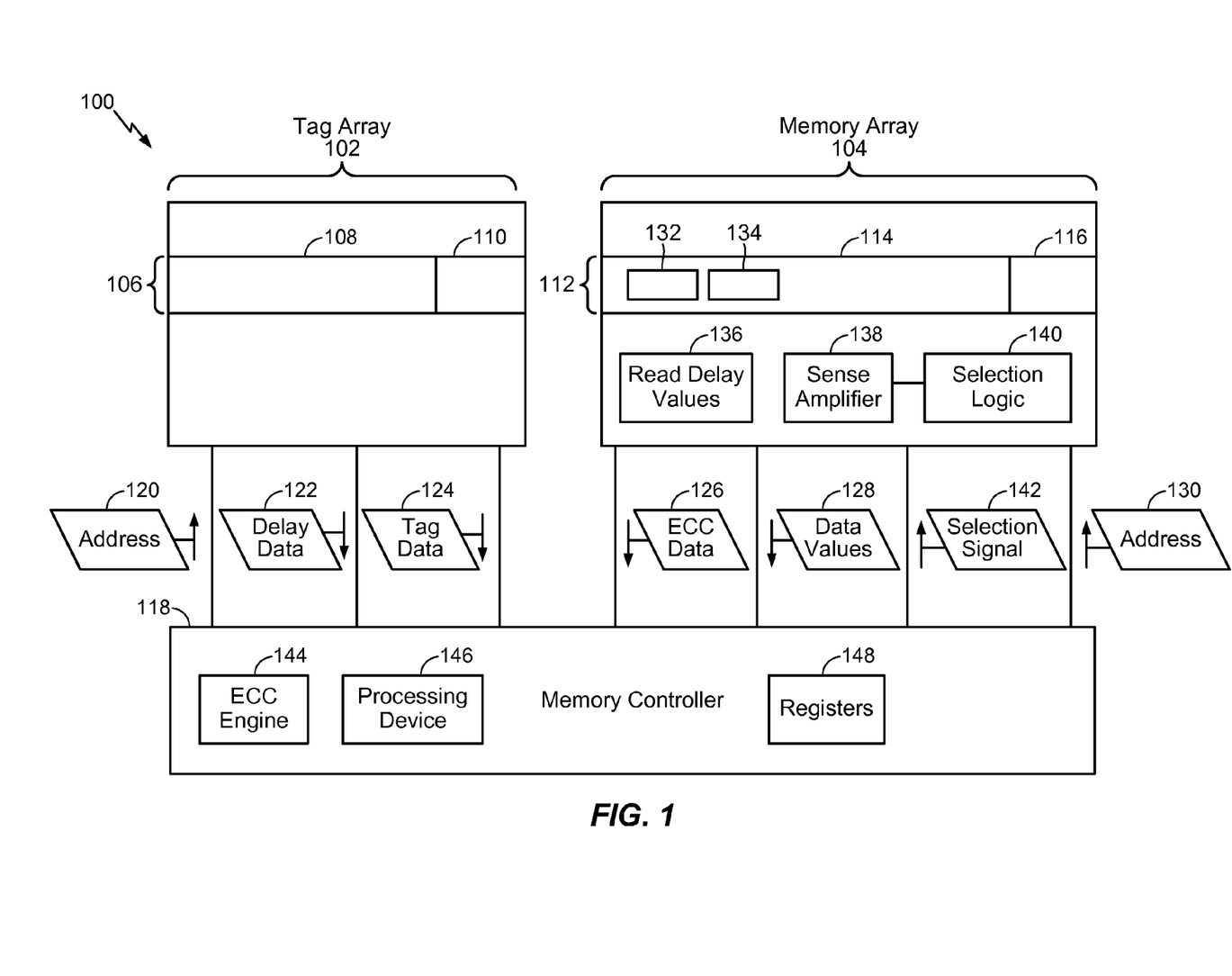
FIG. 1 is a block diagram that illustrates a particular embodiment of a variable read delay system.

Referring to FIG. 1, a particular illustrative embodiment of a variable read delay system is disclosed and generally designated 100. The variable read delay system 100 includes a tag array 102, a memory array 104, and a memory controller 118. The memory array 104 may include one or more rows, such as a representative row 112, a sense amplifier 138, and selection logic 140. In a particular embodiment, the memory array 104 includes read delay values 136. Each row of the memory array 104 may include a data portion and an error correction code (ECC) portion, such as a representative data portion 114 and a representative ECC portion 116. Data stored at the ECC portion of a row may correspond to data stored at the data portion of the row. The memory array 104 may be configured to provide at least one data value 128 and ECC data 126 in response to receiving a corresponding address 130 (e.g., with a read command) from the memory controller 118. The memory controller 118 may include an ECC engine 144, a processing device 146, and one or more registers 148.

The variable read delay system 100 may be integrated in at least one die (e.g., at least one semiconductor die). The memory array 104 may include or correspond to a non-volatile memory device, such as: a magnetoresistive random access memory (MRAM) device, a spin-transfer torque (STT) MRAM device, a flash memory device, a resistive random access memory (ReRAM) device, a phase-change random access memory (PCRAM) device, another non-volatile memory device, or a combination thereof. The memory array 104 may include or correspond to a volatile memory device, such as: a static random access memory (SRAM) device, a dynamic random access memory (DRAM) device, another volatile memory device, or a combination thereof. The memory array 104 may include or correspond to a combination of one or more non-volatile memory devices and one or more volatile memory devices.

Each row of the memory array 104 may include a plurality (e.g., 128) of memory cells, such as a representative first memory cell 132 and a representative second memory cell 134. An output corresponding to the first memory cell 132 may take a different amount of time to settle than an output corresponding to the second memory cell 134. The selection logic 140 is configured to cause the sense amplifier 138 to sense at least one data value from at least one memory cell of the memory array 104 using a first sensing delay (e.g., 4.2 nanoseconds (ns)) or using a second sensing delay (e.g., 8.5 ns), where the second sensing delay is longer than the first sensing delay. The sensing delay may correspond to an amount of time the memory controller 118 waits for an output of the sense amplifier 138 to settle on a value (e.g., corresponding to a logical 1 or a logical 0). The selection logic 140 may select between the first sensing delay and the second sensing delay based on a selection signal 142 received at the selection logic 140 from the memory controller 118. The memory controller 118 may determine (e.g., using the processing device 146) whether to use the first sensing delay or the second sensing delay to read a memory cell based on a default sensing delay or based on a read delay value corresponding to the memory cell. The sense amplifier 138 may be configured to sense data from multiple memory cells of the memory array 104 or from a single memory cell of the memory array 104.

When the sense amplifier 138 senses a data value at a memory cell too quickly (e.g., the memory controller 118 does not wait enough time for the output of the sense amplifier 138 to settle), the sense amplifier 138 may provide an incorrect value from the memory cell to the memory controller 118. For example, the sense amplifier 138 may sense a first data value at the first memory cell 132 and a second data value at the second memory cell 134 using a sensing delay of 4.2 ns. In this example, an output corresponding to the first memory cell 132 may settle within 4.2 ns, but an output corresponding to the second memory cell 134 may take longer than 4.2 ns to settle. Accordingly, the sense amplifier 138 may send an incorrect value from the second memory cell 134 to the memory controller 118. Thus, a first bit error rate corresponding to the first sensing delay may be greater than a second bit error rate corresponding to the second sensing delay.

Each ECC portion of each row may be used by the ECC engine 144 to correct erroneous bits (e.g., an error caused by a read or write failure) in a corresponding data portion. For example, the ECC portion 116 may be used by the ECC engine 144 to correct erroneous bits in the data portion 114. Thus, the ECC portion 116 may be used by the ECC engine 144 to correct an incorrect value read from the second memory cell 134 (e.g., because the sense amplifier 138 sensed the second data value at the second memory cell 134 too quickly). If a number of erroneous bits in the data portion exceeds a number of bits correctable using a corresponding ECC portion, an uncorrectable error may occur.

When the memory controller 118 receives an indication (e.g., from the ECC engine 144 based on the ECC data 126) of an uncorrectable error at a memory location (e.g., the data portion 114) in response to a read operation using the first sensing delay, the memory controller 118 may send a second read request to the memory array 104, where the selection signal 142 indicates the second sensing delay. For example, the selection logic 140 may cause the sense amplifier 138 to sense at least one data value of the memory array 104 using the second sensing delay in response to an indication of an uncorrectable error after the sense amplifier 138 senses the at least one data value of the portion of the memory array 104 using the first sensing delay. Thus, the variable read delay system 100 may have a similar output error rate (e.g., an error rate associated with data provided to a requesting device responsive to a read operation request) as a system where the memory array 104 is only read using the second sensing delay. The first sensing delay may be chosen such that an average memory read time at the memory array 104 is decreased (e.g., timing gains associated with a shorter sensing delay outweigh timing losses due to rereading memory due to uncorrectable errors).

In a particular embodiment, the tag array 102 includes one or more rows, such as a representative row 106. Each row of the tag array 102 may include a tag portion and a delay portion, such as a representative tag portion 108 and a representative delay portion 110, respectively. In this embodiment, the tag array 102 is configured to provide tag data 124 and delay data 122 in response to receiving an address 120 from the memory controller 118. Each row of the tag array 102 may correspond to a row of the memory array 104. For example, the row 106 of the tag array 102 may correspond to the row 112 of the memory array 104. The delay portion 110 of the tag array 102 stores delay data indicating whether a corresponding portion (e.g., the row 112) of the memory array 104 should be read using the first sensing delay or the second sensing delay. In this embodiment, the memory controller 118 receives the delay data 122, indicating whether memory at the address 120 should be read using the first sensing delay or the second sensing delay. In this embodiment, the processing device 146 generates the selection signal 142 based on the delay data 122. In response to the ECC engine 144 detecting an uncorrectable error associated with a read using the first sensing delay, the memory controller 118 is configured to request a read using the second sensing delay and to modify corresponding delay data (e.g., the delay portion 110) at the tag array 102 to indicate the second sensing delay.

In another particular embodiment, the delay data is stored at another memory location (e.g., a register file, such as in the registers 148). The other memory location may be part of the memory controller 118 or part of another device (e.g., another memory device). The delay data may be stored at a memory device that includes or corresponds to a static random access memory (SRAM) array or another type of memory array that can be accessed more quickly, as compared to accessing the memory array 104.

Delay portions (e.g., the delay portion 110 or a delay portion stored at the registers 148) may be stored in a volatile memory device (e.g., to enable retrieving the delay data more quickly, as compared to retrieving the delay data from a non-volatile memory device). Data stored at a volatile memory device may be lost when an electronic device that includes the volatile memory device is powered down. In a particular embodiment, the memory array 104 is a non-volatile memory and is configured to store the read delay values 136 (e.g., delay information corresponding to the delay portion 110 or to a delay portion stored at the registers 148), and the memory controller 118 is configured to transfer the read delay values 136 from the memory array 104 to the volatile memory device in response to a powerup of the electronic device that includes the volatile memory device (or from the registers 148). The transfer of the read delay values 136 may be a serial transfer operation (e.g., the read delay values 136 are transferred one bit at a time) or may be a parallel transfer operation (e.g., multiple bits of the read delay values 136 are transferred simultaneously). Subsequently, the memory controller 118 may read the delay information (e.g., corresponding to the delay portion or to a delay portion stored at the registers 148) from the volatile memory device (or from the registers 148). During operation, after delay information at the volatile memory is updated (e.g., due to an uncorrectable error), the read delay values 136 may be updated.

An electronic device that includes the variable read delay system 100 may have a lower average memory read time, as compared to an electronic device that only reads data values using the second sensing delay. The electronic device that includes the variable read delay system 100 may have a similar output error rate (e.g., an error rate associated with data provided to a requesting device responsive to a read operation request) as the electronic device that only reads data values using the second sensing delay. Thus, a read performance of the memory array 104 is improved.

Figure 2:
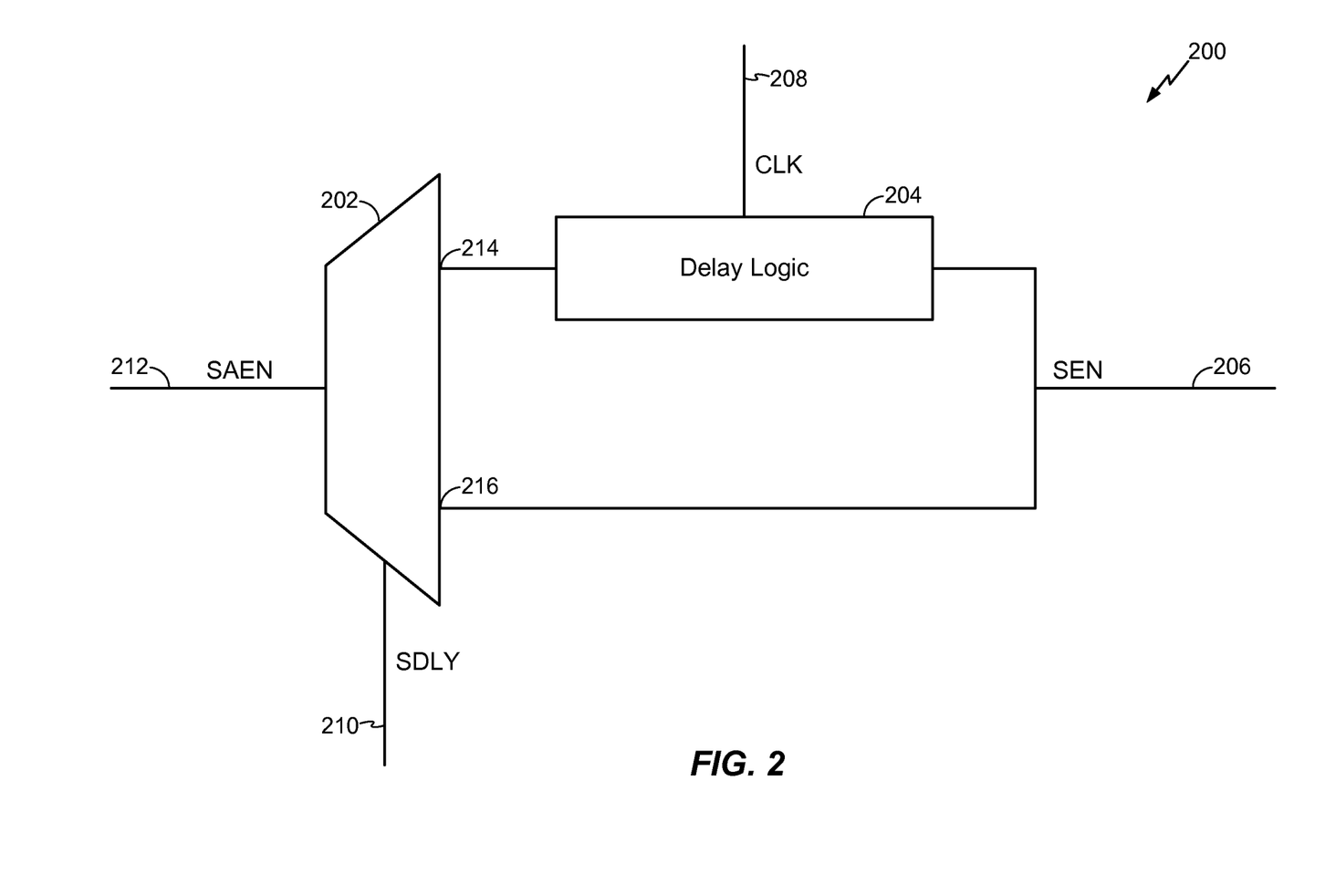
FIG. 2 is a diagram depicting a particular embodiment of selection logic of a variable read delay system.

Referring to FIG. 2, a particular illustrative example of selective delay circuitry 200 is shown. The selective delay circuitry 200 may be included in or used to implement the selection logic 140 of FIG. 1. The selective delay circuitry 200 includes a multiplexer 202 and delay logic 204. The multiplexer 202 includes a first input 214 and a second input 216. The first input 214 receives an output from the delay logic 204. The delay logic 204 receives a sense enable signal 206 at its input and also receives a clock signal 208.

The second input 216 to the multiplexer 202 receives the sense enable signal 206. The multiplexer 202 has a control input that receives a sense delay control signal 210. The multiplexer 202 provides a sense amplifier enable signal at a sense amplifier enable output 212. The sense delay control signal 210 may correspond to or be based on the selection signal 142 of FIG. 1.

During operation, the multiplexer 202, in response to receipt of the sense delay control signal 210, provides a delayed enable signal (from the delay logic 204) or the sense enable signal 206 at its output (sense amplifier enable output 212). The sense delay control signal 210 controls the multiplexer 202 to provide the non-delayed sense enable signal 206 as the sense amplifier enable output 212 or to provide a delayed version of the sense enable signal 206 at the sense amplifier enable output 212. Thus, the selective delay circuitry 200 may either provide a sense enable signal 206 that is passed through a multiplexer as a sense amplifier enable output 212 or may selectively provide a delayed version of the sense enable signal 206 as the sense amplifier enable output 212. The sense amplifier enable signal SAEN (from the sense amplifier enable output 212) may be provided to other logic components (e.g., to the sense amplifier 138 of FIG. 1) in order to selectively delay enabling such components.

Figure 3:
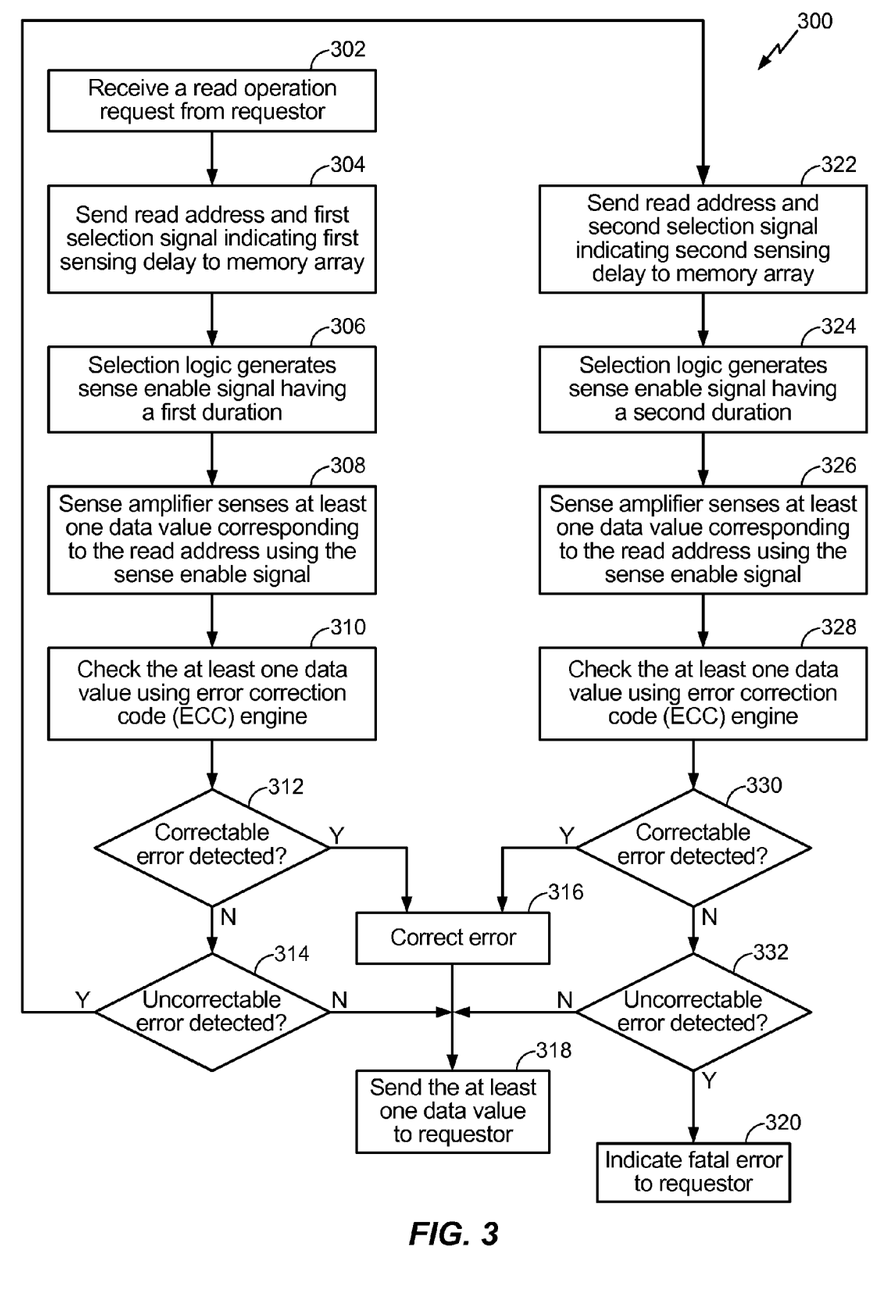
FIG. 3 is a flow chart that illustrates a particular embodiment of a method of operating a variable read delay system.

Referring to FIG. 3, a particular illustrative embodiment of a method 300 of operating a memory array is shown. The method 300 includes receiving a read operation request from a requester (e.g., a processor that requests one or more data values from the memory array), at 302, and sending a read address and a first selection signal indicating a first sensing delay to a memory array, at 304. The method 300 further includes generating an enable signal having a first duration, at 306. The method 300 further includes a sense amplifier sensing at least one data value corresponding to the read address using the sense enable signal, at 308. As an example, the sense amplifier 138 may sense a data value from the memory array 104 and the sense amplifier 138 may be driven by the sense enable signal SAEN via the sense amplifier enable output 212.

The method 300 further includes checking the at least one data value using an error correction code (ECC) engine, at 310. If the at least one data value has a correctable error, as determined at 312, then the error is corrected, at 316, and the at least one data value is sent to the requester, at 318. For example, the at least one data value 128 may be sent by the memory controller 118 to the requester or to another component within an electronic device that includes the variable read delay system 100. If an uncorrectable error is detected, at 314, then an error correction operation may be attempted. If the error remains uncorrectable, as determined at 314, then the method 300 proceeds to step 322. If no error (correctable or uncorrectable) is detected, then the at least one data value is sent to the requester, at 318.

Referring to method step 322, the read address is sent and a second selection signal (e.g., selection signal 142) is sent indicating that the second sensing delay is to be used for accessing the memory array. The method 300 further includes, at 324, the selection logic generating a sense enable signal having a second duration. In a particular embodiment, the second duration is greater than the first duration referenced with respect to step 306. The method 300 further includes the sense amplifier sensing at least one data value corresponding to the read address using the sense enable signal having the second duration, at 326. For example, the selection logic may provide the delayed version of the sense enable signal 206 (e.g., received at the first input 214 of the multiplexer 202) to the sense amplifier 138. After sensing the at least one data value using the sense enable signal having the second duration, the at least one data value is checked using an error correction code engine, at 328. For example, the ECC engine 144 may perform error correction operations on the at least one data value 128 and the ECC data 126. If the at least one data value only includes correctable errors, then the decision logic determines, at 330, that a correctable error has been detected and the method 300 then corrects the error, at 316, and sends at least one corrected data value to a requester, at 318. However, if a correctable error is not detected, at 330, then, at 332, a second evaluation is performed in order to determine whether the at least one data value includes an uncorrectable error. If the error is uncorrectable, then the method 300 indicates a fatal error to the requester, at 320. If no error (correctable or uncorrectable) is detected, then the at least one data value is sent to the requester, at 318.

The method 300 may be used to perform memory accesses using a sense enable signal having a first delay (e.g., a short delay) in an attempt to read data from a memory array. In the event that the first attempt to read data from the memory array is unsuccessful (e.g., due to uncorrectable errors), then the method 300 proceeds to make a second attempt to read data from the memory array. With the second attempt, a sense enable signal having a second delay (the second delay being greater than the first delay) is used in order to read data from the memory array. Thus, the method 300 may be used to attempt to read data quickly by using a sense enable signal having a short duration but to recover from failed read attempts by selectively making a second attempt to read data using a second sense enable signal having a second duration (e.g., a longer duration) in order to attempt to correct errors associated with the read access. Accordingly, the method 300 provides improved performance in terms of read access time while also providing increased robustness due to additional read and error correction attempts.

As described above, the method 300 responds to a read operation request by selecting a particular sensing delay. For example, the sensing delay may be a first sensing delay or a second sensing delay. In the particular example described, the second sensing delay is longer than the first sensing delay. The method 300 further sends a signal (e.g., a sense amplifier enable signal having the selected sensing delay) to a sense amplifier in order to cause the sense amplifier to sense at least one data value corresponding to the read operation request. The method 300 further includes, when the particular sensing delay corresponds to the first sensing delay, and in response to error correction code information associated with the delay values indicating an uncorrectable error, sending a second signal to the sense amplifier to cause the sense amplifier to sense the data using the second sensing delay. For example, at 314, upon determining or detecting an uncorrectable error, the method 300 proceeds to 322 to send a read address and a second selection signal indicating a second sensing delay to a memory array and performing further operations in order to send a second signal to the sense amplifier to cause the sense amplifier to sense the at least one data value using the second sensing delay.

In a particular illustrative embodiment, selecting the particular sensing delay (e.g., either the first sensing delay or the second sensing delay) includes receiving a read delay value and selecting the particular sensing delay based on the read delay value. For example, a lookup table may be accessed in order to read a particular delay value. In another embodiment, a particular register value may be read in order to receive the read delay value. In this manner, since the read delay value may be used in order to determine the particular sensing delay, the particular sensing delay is programmable. In a particular illustrative embodiment, when changing from use of the first sensing delay to the second sensing delay, the read data value may be modified in order to indicate the second sensing delay. For example, an entry in a table or a register may be updated or otherwise modified to indicate the second sensing delay. For example, the read data value may be stored at a second memory device and may correspond to particular cells to be read based on the read operation request, such as a read operation request received from a memory controller.

An electronic device that operates according to the method 300 may have a lower average memory read time, as compared to an electronic device that only reads data values using the second sensing delay. The electronic device that operates according to the method 300 may have a similar output error rate (e.g., an error rate associated with data provided to a requesting device responsive to a read operation request) as the electronic device that only reads data values using the second sensing delay.

Figure 4:
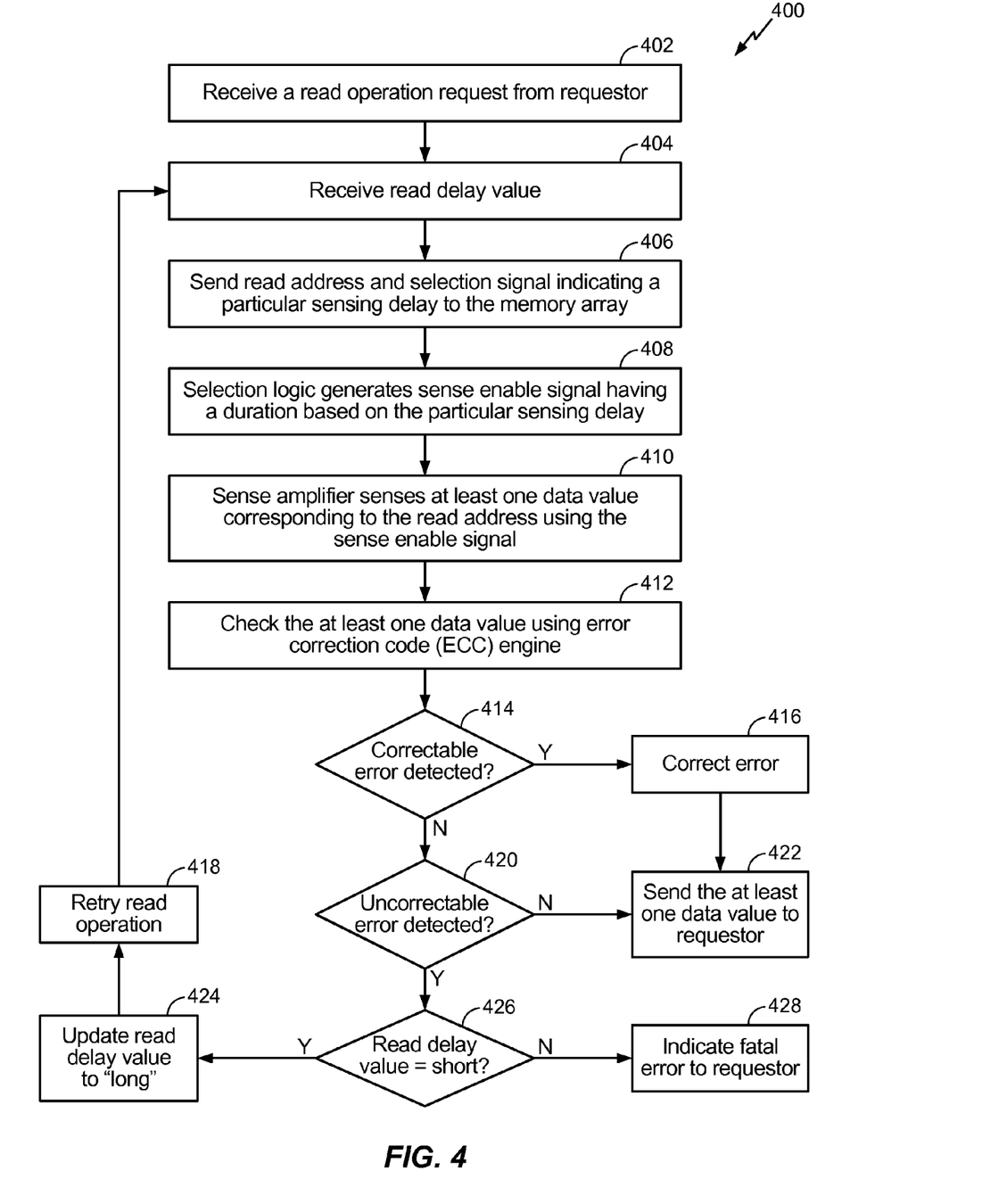
FIG. 4 is a flow chart that illustrates a particular embodiment of a method of operating a variable read delay system.

Referring to FIG. 4, a particular illustrative embodiment of a method 400 of operating a memory array is shown. The method 400 includes receiving a read operation request from a requester (e.g., a processor that requests one or more data values from the memory array), at 402, and receiving a read delay value, at 404. As an example, the read delay value may be received from the tag array 102 or from the registers 148. The method 400 further includes sending a read address and a selection signal indicating a particular sensing delay to a memory array, at 406. For example, the particular sensing delay may be based on the read delay value. The method 400 further includes generating an enable signal having a duration based on the particular sensing delay, at 408. The method 400 further includes a sense amplifier sensing at least one data value corresponding to the read address using the sense enable signal, at 410. As an example, the sense amplifier 138 may sense a data value from the memory array 104 and the sense amplifier 138 may be driven by the sense enable signal SAEN via the sense amplifier enable output 212.

The method 400 further includes checking the at least one data value using an error correction code (ECC) engine, at 412. If the at least one data value has a correctable error, as determined at 414, then the error is corrected, at 416, and the at least one data value is sent to the requester, at 422. For example, the at least one data value 128 may be sent by the memory controller 118 to the requester or to another component within an electronic device that includes the variable read delay system 100. If an uncorrectable error is detected, at 420, then an error correction operation may be attempted. If the error remains uncorrectable, as determined at 420, then the method 400 proceeds to 426. If no error (correctable or uncorrectable) is detected, then the at least one data value is sent to the requester, at 422.

The method 400 further includes determining whether the particular read delay value indicates a short read delay (e.g., corresponding to a first sensing delay). If the read delay value indicates a long read delay (e.g., corresponding to a second sensing delay that is longer than the first sensing delay), then the method 400 indicates a fatal error to the requester, at 428. If the read delay value indicates a short read delay, then the read delay value is updated to indicate a long read delay, at 424. In a particular embodiment, the delay portion 110 is updated from indicating a first sensing delay to indicating a second sensing delay in response to detecting an uncorrectable error after reading memory cells corresponding to the delay portion 110 using the first sensing delay. The method 400 further includes, after updating the read delay value, retrying the read operation, at 418 and proceeding to step 404. In another particular embodiment, the method 400 may include proceeding from 418 to 406, where the sensing delay is based on the updated read delay value (e.g., the long read delay value).

The method 400 may be used to perform memory accesses using a sense enable signal having a particular duration (e.g., a short duration corresponding to a short sensing delay or a long duration corresponding to a long sensing delay) in an attempt to read data from a memory array. For example, if a memory access using the short duration resulted in an uncorrectable error, the method 400 may perform a memory access using the long duration. In the event that the first attempt to read data from the memory array is unsuccessful (e.g., due to uncorrectable errors), and the first attempt used the short duration then the method 400 updates a read delay value and proceeds to make a second attempt to read data from the memory array. With the second attempt, a sense enable signal having a second duration (the second duration being greater than the first duration) is used in order to read data from the memory array. Thus, the method 400 may be used to attempt to read data quickly by using a sense enable signal having a short duration and may recover from failed read attempts by selectively making a second attempt to read data using a second sense enable signal having a second duration (e.g., a longer duration) in order to attempt to correct errors associated with the read access. Further, the method 400 may be used to determine and store information as to which bits will fail when a read using the short duration is performed. Accordingly, the method 400 provides improved performance in terms of read access time while also providing increased robustness due to additional read and error correction attempts.

As described above, the method 400 responds to a read operation request by selecting a particular sensing delay based on a received read delay value. For example, the sensing delay may be a first sensing delay or a second sensing delay. In the particular example described, the second sensing delay is longer than the first sensing delay. The method 400 further sends a signal (e.g., a sense amplifier enable signal having the selected sensing delay) to a sense amplifier in order to cause the sense amplifier to sense at least one data value corresponding to the read operation request. The method 400 further includes, when the particular sensing delay corresponds to the first sensing delay, and in response to error correction code information associated with the delay values indicating an uncorrectable error, sending a second signal to the sense amplifier to cause the sense amplifier to sense the data using the second sensing delay. For example, at 418, upon determining or detecting an uncorrectable error using a first read delay value (e.g., a short read delay value), the method 400 proceeds to 404 to receive a second read delay value (e.g., a long read delay value) indicating a second sensing delay. The method 400 performs further operations in order to send a second signal to the sense amplifier to cause the sense amplifier to sense the at least one data value using the second sensing delay.

In a particular illustrative embodiment, a lookup table may be accessed in order to read the particular delay value. In another embodiment, a tag array may be accessed in order to receive the particular delay value. In another embodiment, a particular register value may be read in order to receive the particular read delay value. In another embodiment, another memory device may be accessed in order to receive the particular delay value. In this manner, since the read delay value may be used in order to determine the particular sensing delay, the particular sensing delay is programmable. In a particular illustrative embodiment, when changing from use of the first sensing delay to the second sensing delay, the read data value may be modified in order to indicate the second sensing delay. For example, an entry in a table or a register may be updated or otherwise modified to indicate the second sensing delay. For example, the read data value may be stored at a second memory device and may correspond to particular cells to be read based on the read operation request, such as a read operation request received from a memory controller.

An electronic device that operates according to the method 400 may have a lower average memory read time, as compared to an electronic device that only reads data values using the second sensing delay. The electronic device that operates according to the method 400 may have a similar output error rate (e.g., an error rate associated with data provided to a requesting device responsive to a read operation request) as the electronic device that only reads data values using the second sensing delay.

Figure 5:
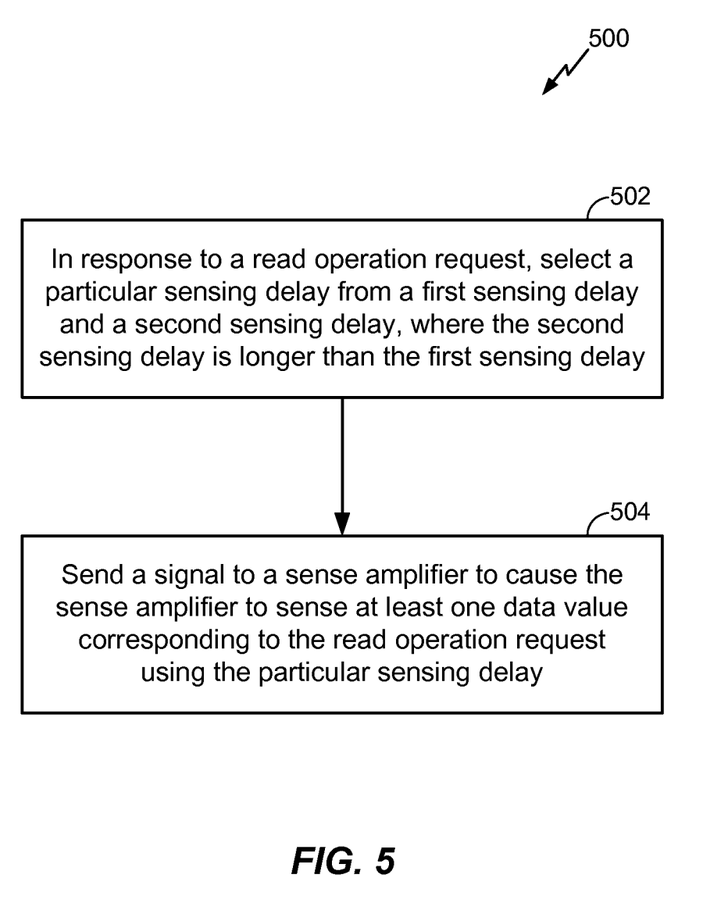
FIG. 5 is a flow chart that illustrates a particular embodiment of a method of operating a variable read delay system.

FIG. 5 is a flowchart illustrating a method 500 of operating a variable read delay system. The method 500 includes, at 502, in response to a read operation request, selecting a particular sensing delay from a first sensing delay and a second sensing delay. The second sensing delay may be longer than the first sensing delay. For example, the selection logic 140 of FIG. 1 may select between the first sensing delay and the second sensing delay based on the selection signal 142 received from the memory controller 118.

The method 500 also includes, at 504, sending a signal to a sense amplifier to cause the sense amplifier to sense at least one data value corresponding to the read operation request using the particular sensing delay. For example, the selection logic 140 may send a signal to the sense amplifier 138 to cause the sense amplifier to sense at least one data value corresponding to the read operation request using the particular sensing delay.

The method 500 of FIG. 5 may be initiated and/or performed by a processing unit such as a central processing unit (CPU), a field-programmable gate array (FPGA) device, an application-specific integrated circuit (ASIC), a controller, another hardware device, a firmware device, or any combination thereof. As an example, the method 500 of FIG. 5 can be performed or initiated by one or more processors or execution units that execute instructions, as further described with reference to FIG. 6.

An electronic device that operates according to the method 500 may have a lower average memory read time, as compared to an electronic device that only reads data values using the second sensing delay. The electronic device that operates according to the method 500 may have a similar output error rate (e.g., an error rate associated with data provided to a requesting device responsive to a read operation request) as the electronic device that only reads data values using the second sensing delay.

Figure 6:
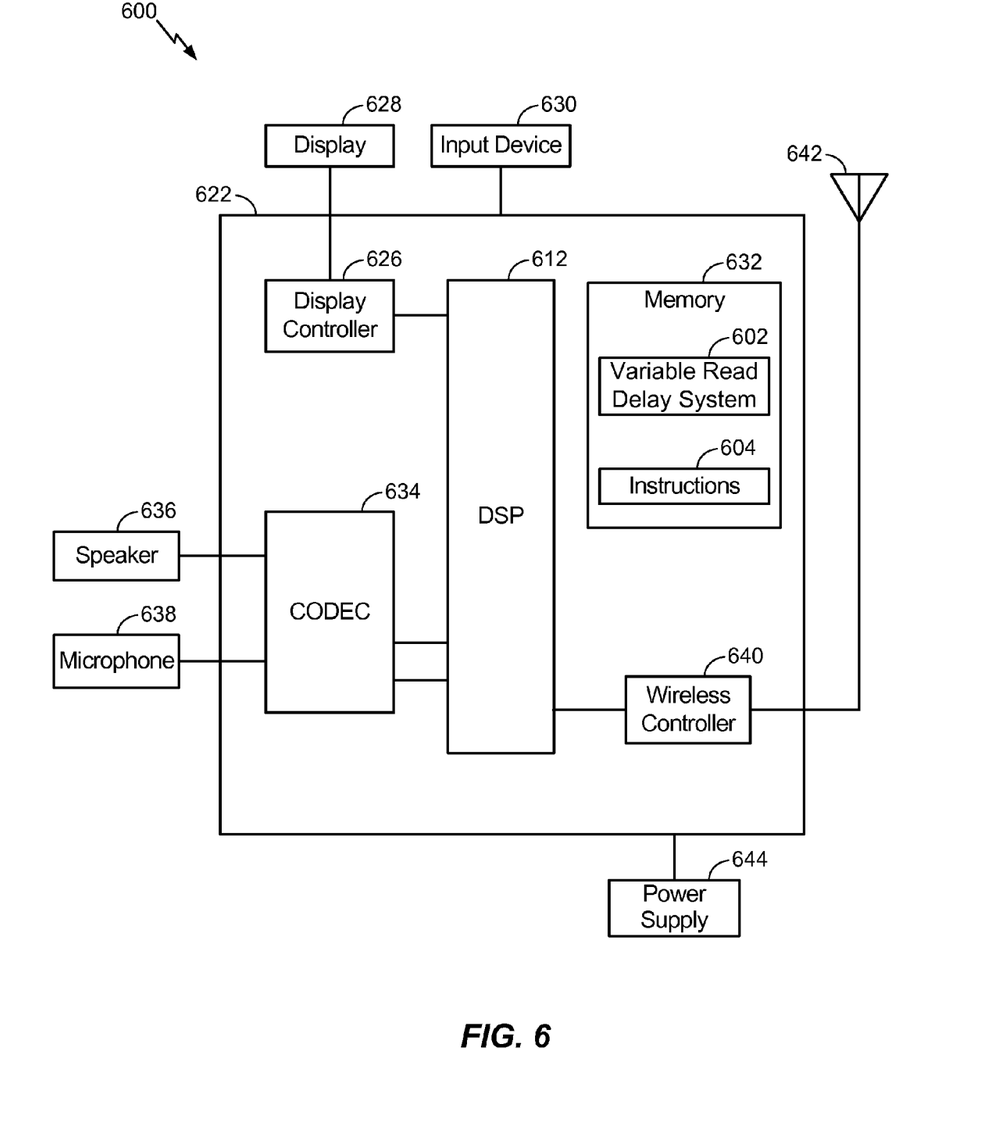
FIG. 6 is a block diagram that illustrates a particular embodiment of a communication device including a variable read delay system.

Referring to FIG. 6, a block diagram depicts a particular illustrative embodiment of a mobile device 600 that includes a variable read delay system 602. The mobile device 600, or components thereof, may include, implement, or be included within a device such as a communications device, a mobile phone, a cellular phone, a computer, a portable computer, a tablet, an access point, a set top box, an entertainment unit, a navigation device, a personal digital assistant (PDA), a fixed location data unit, a mobile location data unit, a desktop computer, a monitor, a computer monitor, a television, a tuner, a radio, a satellite radio, a music player, a digital music player, a portable music player, a video player, a digital video player, a digital video disc (DVD) player, or a portable digital video player. The variable read delay system 602 may correspond to the variable read delay system 100 of FIG. 1.

The mobile device 600 may include a processor 612, such as a digital signal processor (DSP). The processor 612 may be coupled to a memory 632 (e.g., a non-transitory computer-readable medium). The memory 632 may include the variable read delay system 602 or may be distinct from the variable read delay system 602. The memory array 104 may correspond to a portion of the memory 632. The variable read delay system 602 may be configured to read at least one data value using a first sensing delay or using a second sensing delay, as described with reference to FIGS. 3-5. The memory 632 may include computer-readable instructions 604. The instructions 604 may be executed by the processor 612 in order to perform method operations described with respect to FIG. 3, 4, or 5.

FIG. 6 also shows a display controller 626 that is coupled to the processor 612 and to a display 628. A coder/decoder (CODEC) 634 can also be coupled to the processor 612. A speaker 636 and a microphone 638 can be coupled to the CODEC 634. A wireless controller 640 can be coupled to the processor 612 and can be further coupled to an antenna 642.

In a particular embodiment, the processor 612, the display controller 626, the memory 632, the CODEC 634, and the variable read delay system 602 are included in a system-in-package or system-on-chip device 622. An input device 630 and a power supply 644 may be coupled to the system-on-chip device 622. Moreover, in a particular embodiment, and as illustrated in FIG. 6, the display 628, the input device 630, the speaker 636, the microphone 638, the antenna 642, and the power supply 644 are external to the system-on-chip device 622. However, each of the display 628, the input device 630, the speaker 636, the microphone 638, the antenna 642, and the power supply 644 can be coupled to a component of the system-on-chip device 622, such as an interface or a controller. The variable read delay system 602 may be included in the system-on-chip device 622, as shown in FIG. 6, or may be included in one or more separate components.

In a particular embodiment of an electronic device that includes a memory that includes a memory array, and that includes a second memory, in response to a power-up of the electronic device, a plurality of read data values may be transferred from the memory array to the second memory. For example, the memory array may correspond to a non-volatile memory device and the second memory may correspond to a volatile memory device. The operations of selecting a particular sensing delay value and sending sensing enable signals may be initiated by a processor integrated in the electronic device. For example, a processor, such as the processor 612 or another processor within the system-on-chip device 622, may initiate selecting a particular sensing delay signal and sending one or more signals to a memory array, such as a memory within the system-on-chip device 622. As a further example, instructions, such as the instructions 604 stored at the memory 632, may be executed by a processor, such as the processor 612, in order to perform the method operations described with respect to FIG. 3, 4, or 5.

In conjunction with the described embodiments, an apparatus (such as the mobile device 600) may include means (e.g., the memory array 104 of FIG. 1 or the memory 632 of FIG. 6) for storing data. The apparatus may further include means (e.g., the sense amplifier 138 of FIG. 1) for sensing at least one data value from the means for storing data. The apparatus may further include means (e.g., the selection logic 140 of FIG. 1 or the selective delay circuitry 200 of FIG. 2) for selecting between causing the means for sensing at least one data value to sense the at least one data value using a first sensing delay and causing the means for sensing at least one data value to sense the at least one data value using a second sensing delay.

Figure 7:
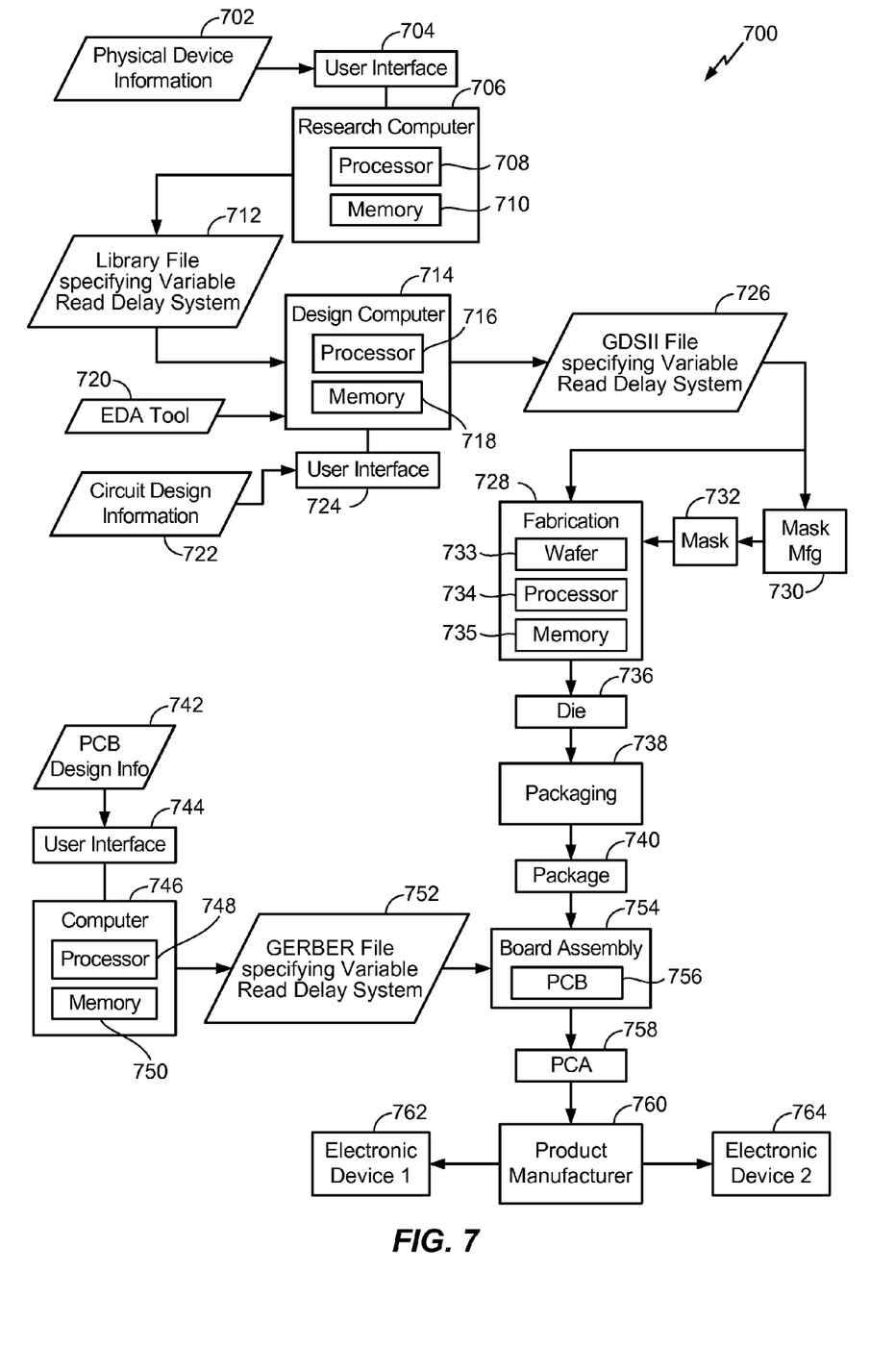
FIG. 7 is a data flow diagram of a particular illustrative embodiment of a manufacturing process to manufacture electronic devices that include a variable read delay system.

The foregoing disclosed devices and functionalities may be designed and configured into computer files (e.g. RTL, GDSII, GERBER, etc.) stored on computer-readable media. Some or all such files may be provided to fabrication handlers to fabricate devices based on such files. Resulting products include wafers that are then cut into dies and packaged into chips. The chips are then employed in devices described above. FIG. 7 depicts a particular illustrative embodiment of an electronic device manufacturing process 700.

Physical device information 702 is received at the manufacturing process 700, such as at a research computer 706. The physical device information 702 may include design information representing at least one physical property of an electronic device that includes a variable read delay system (e.g., corresponding to the variable read delay system 100 of FIG. 1 or the variable read delay system 602 of FIG. 6). For example, the physical device information 702 may include physical parameters, material characteristics, and structure information that is entered via a user interface 704 coupled to the research computer 706. The research computer 706 includes a processor 708, such as one or more processing cores, coupled to a computer-readable medium such as a memory 710. The memory 710 may store computer-readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of electronic devices (e.g., semiconductor devices) that includes a variable read delay system (e.g., corresponding to the variable read delay system 100 of FIG. 1 or the variable read delay system 602 of FIG. 6), provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a circuit that includes a variable read delay system (e.g., corresponding to the variable read delay system 100 of FIG. 1 or the variable read delay system 602 of FIG. 6), using the library file 712. For example, a user of the design computer 714 may enter circuit design information 722 via a user interface 724 coupled to the design computer 714. The circuit design information 722 may include design information representing at least one physical property of an electronic device that includes a variable read delay system (e.g., corresponding to the variable read delay system 100 of FIG. 1 or the variable read delay system 602 of FIG. 6). To illustrate, the circuit design property may include identification of particular circuits and relationships to other elements in a circuit design, positioning information, feature size information, interconnection information, or other information representing a physical property of an electronic device.

The design computer 714 may be configured to transform the design information, including the circuit design information 722, to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing a variable read delay system (e.g., corresponding to the variable read delay system 100 of FIG. 1 or the variable read delay system 602 of FIG. 6), and that also includes additional electronic circuits and components within the SOC.

The GDSII file 726 may be received at a fabrication process 728 to manufacture a variable read delay system (e.g., corresponding to the variable read delay system 100 of FIG. 1 or the variable read delay system 602 of FIG. 6) according to transformed information in the GDSII file 726. For example, a device manufacture process may include providing the GDSII file 726 to a mask manufacturer 730 to create one or more masks, such as masks to be used with photolithography processing, illustrated in FIG. 7 as a representative mask 732. The mask 732 may be used during the fabrication process to generate one or more wafers 733, which may be tested and separated into dies, such as a representative die 736. The die 736 includes a circuit including a variable read delay system (e.g., corresponding to the variable read delay system 100 of FIG. 1 or the variable read delay system 602 of FIG. 6).

In a particular embodiment, the fabrication process 728 may be initiated by or controlled by a processor 734. The processor 734 may access a memory 735 that includes executable instructions such as computer-readable instructions or processor-readable instructions. The executable instructions may include one or more instructions that are executable by a computer, such as the processor 734.

The fabrication process 728 may be implemented by a fabrication system that is fully automated or partially automated. For example, the fabrication process 728 may be automated and may perform processing steps according to a schedule. The fabrication system may include fabrication equipment (e.g., processing tools) to perform one or more operations to form an electronic device. For example, the fabrication equipment may be configured to form integrated circuit elements using integrated circuit manufacturing processes (e.g., wet etching, dry etching, deposition, planarization, lithography, or a combination thereof).

The fabrication system may have a distributed architecture (e.g., a hierarchy). For example, the fabrication system may include one or more processors, such as the processor 734, one or more memories, such as the memory 735, and/or controllers that are distributed according to the distributed architecture. The distributed architecture may include a high-level processor that controls or initiates operations of one or more low-level systems. For example, a high-level portion of the fabrication process 728 may include one or more processors, such as the processor 734, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular embodiment, the fabrication system may include multiple processors that are distributed in the fabrication system. For example, a controller of a low-level system component of the fabrication system may include a processor, such as the processor 734.

Alternatively, the processor 734 may be a part of a high-level system, subsystem, or component of the fabrication system. In another embodiment, the processor 734 includes distributed processing at various levels and components of a fabrication system.

Thus, the memory 735 may include processor-executable instructions that, when executed by the processor 734, cause the processor 734 to initiate or control formation of a variable read delay system (e.g., corresponding to the variable read delay system 100 of FIG. 1 or the variable read delay system 602 of FIG. 6).

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged electronic device on a circuit board, the packaged electronic device corresponding to the package 740 including a variable read delay system (e.g., corresponding to the variable read delay system 100 of FIG. 1 or the variable read delay system 602 of FIG. 6).

The computer 746 may be configured to transform the PCB design information 742 to generate a data file, such as a GERBER file 752 with data that includes physical positioning information of a packaged electronic device on a circuit board, as well as layout of electrical connections such as traces and vias, where the packaged electronic device corresponds to the package 740 including a variable read delay system (e.g., corresponding to the variable read delay system 100 of FIG. 1 or the variable read delay system 602 of FIG. 6). In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacturer 760 and integrated into one or more electronic devices, such as a first representative electronic device 762 and a second representative electronic device 764. As an illustrative, non-limiting example, the first representative electronic device 762, the second representative electronic device 764, or both, may be selected from a mobile phone, a tablet, a computer, a communications device, a set top box, a music player, a video player, an entertainment unit, a navigation device, a personal digital assistant (PDA), and a fixed location data unit, into which a variable read delay system (e.g., corresponding to the variable read delay system 100 of FIG. 1 or the variable read delay system 602 of FIG. 6), is integrated. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 7 illustrates remote units according to teachings of the disclosure, the disclosure is not limited to these illustrated units. Embodiments of the disclosure may be suitably employed in any device which includes active integrated circuitry including memory and on-chip circuitry.

A device that includes a variable read delay system (e.g., corresponding to the variable read delay system 100 of FIG. 1 or the variable read delay system 602 of FIG. 6), may be fabricated, processed, and incorporated into an electronic device, as described in the illustrative manufacturing process 700. One or more aspects of the embodiments disclosed with respect to FIGS. 1-6 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages are depicted with reference to FIGS. 1-6, in other embodiments fewer stages may be used or additional stages may be included. Similarly, the process 700 of FIG. 7 may be performed by a single entity or by one or more entities performing various stages of the manufacturing process 700.

In conjunction with the described embodiments, a non-transitory computer-readable medium stores instructions that, when executed by a processor, cause the processor to initiate selecting, in response to a read operation request, a particular sensing delay from a first sensing delay and a second sensing delay. The second sensing delay may be longer than the first sensing delay. The non-transitory computer readable medium further stores instructions that, when executed by the processor, cause the processor to initiate sending a signal to a sense amplifier to cause the sense amplifier to sense at least one data value corresponding to the read operation request using the particular sensing delay.

The non-transitory computer-readable medium may correspond to the memory array 104 of FIG. 1 or to the memory 632 of FIG. 6. The processor may correspond to the processor 612 of FIG. 6. The sense amplifier may correspond to the sense amplifier 138 of FIG. 1.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in memory, such as random-access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM). The memory may include any form of non-transient storage medium known in the art. An exemplary storage medium (e.g., memory) is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a first memory array comprising a first plurality of rows;
   a second memory array comprising a second plurality of rows, wherein each row of the second memory array corresponds to a respective row of the first memory array and includes a tag portion and a delay portion, the delay portion configured to store delay data corresponding to the respective row of the first memory array;
   a sense amplifier of the first memory array configured to sense at least one data value from a first row of the first plurality of rows of the first memory array; and
   selection logic of the first memory array configured to select between causing the sense amplifier to sense the at least one data value according to at least one of a first sensing delay or a second sensing delay based on the delay data stored in the delay portion of a first row of the second memory array that corresponds to the first row of the first memory array, wherein the second sensing delay is greater than the first sensing delay.

2. The apparatus of claim 1, wherein a first bit error rate corresponding to the first sensing delay is greater than a second bit error rate corresponding to the second sensing delay.

3. The apparatus of claim 1, further comprising a memory controller configured to:
   initiate a first read operation of the at least one data value, wherein initiating the first read operation comprises sending, to the selection logic, a first selection signal that causes the selection logic to cause the sense amplifier to receive an enable signal that is delayed according to the first sensing delay; and based on error correction code (ECC) information associated with the at least one data value indicating an uncorrectable error corresponding to the first read operation, initiate a second read operation of the at least one data value, wherein initiating the second read operation comprises sending, to the selection logic, a second selection signal that causes the selection logic to cause the sense amplifier to receive an enable signal that is delayed according to the second sensing delay.

4. The apparatus of claim 3, wherein the memory controller is configured to indicate a fatal error in response to detecting an uncorrectable error that is not correctable using the error correcting code (ECC) information after the sense amplifier receives an enable signal that is delayed according to the second sensing delay.

5. The apparatus of claim 1, wherein the second memory array stores a plurality of read delay values, wherein the second memory array is a different type of memory array from the first memory array; and further comprising:

a memory controller configured to initiate a read operation of the at least one data value, wherein initiating the read operation comprises sending, to the selection logic, based on a corresponding read delay value of the plurality of read delay values, a selection signal that causes the selection logic to select either the first sensing delay or the second sensing delay.

6. The apparatus of claim 5, wherein the memory controller is configured to, after reading the at least one data value using the first sensing delay, based on error correction code (ECC) information associated with the at least one data value indicating an uncorrectable error, modify the corresponding read delay value of the plurality of read delay values to indicate the second sensing delay.

7. The apparatus of claim 6, wherein the memory controller is configured to indicate a fatal error in response to detecting an uncorrectable error that is not correctable using the error correcting code (ECC) information after the sense amplifier receives an enable signal that is delayed according to the second sensing delay.

8. The apparatus of claim 5, wherein the second memory array corresponds to a volatile memory device and the first memory array corresponds to a non-volatile memory device, wherein the second memory array comprises the plurality of read delay values, and wherein the memory controller is configured to transfer the plurality of read delay values from the first memory array to the second memory array upon powering on an electronic device that comprises the first memory array and the second memory array.

9. The apparatus of claim 8, wherein the transfer of the plurality of read delay values comprises a serial transfer operation.

10. The apparatus of claim 8, wherein the transfer of the plurality of read delay values comprises a parallel transfer operation.

11. The apparatus of claim 5, wherein the first memory array comprises a magnetoresistive random access memory (MRAM) array, a spin-transfer torque (STT) MRAM array, a flash memory array, a resistive random access memory (ReRAM) array, a phase change random access memory (PCRAM) array, a static random access memory (SRAM) array, a dynamic random access memory (DRAM) array, or a combination thereof.

12. The apparatus of claim 5, wherein the second memory array comprises a static random access memory (SRAM) array.

13. The apparatus of claim 5, wherein the second memory array is a tag array configured to store information that maps memory addresses to wordlines of the first memory array.

14. The apparatus of claim 5, wherein the second memory array comprises a plurality of registers.

15. The apparatus of claim 14, wherein the plurality of read delay values are stored at the first memory array, and wherein the memory controller is configured to transfer the plurality of read delay values from the first memory array to the plurality of registers upon powering on an electronic device that comprises the plurality of registers and the first memory array.

16. The apparatus of claim 1, integrated in at least one die.

17. The apparatus of claim 1, further comprising a device selected from a mobile phone, a tablet, a set top box, a music player, a video player, an entertainment unit, a navigation device, a communications device, a personal digital assistant (PDA), a fixed location data unit, and a computer, into which the first memory array is integrated.

18. A method comprising:

in response to a read operation request, selecting a particular sensing delay from a first sensing delay or a second sensing delay, wherein the second sensing delay is greater than the first sensing delay; and sending a signal to a sense amplifier to cause the sense amplifier to sense at least one data value in a first row of a first memory array according to the particular sensing delay, the first memory array comprising a first plurality of rows, wherein the particular sensing delay is selected based on delay data stored in a delay portion of a first row of a second memory array that corresponds to a first row of the first memory array, wherein the second memory array comprises a second plurality of rows, wherein each row of the second memory array corresponds to a respective row of the first memory array and includes a tag portion and the delay portion.

19. The method of claim 18, further comprising:

when the particular sensing delay corresponds to the first sensing delay, in response to error correction code (ECC) information associated with the at least one data value indicating an uncorrectable error, sending a second signal to the sense amplifier to cause the sense amplifier to receive an enable signal that is delayed according to the second sensing delay.

20. The method of claim 18, wherein the first sensing delay includes a first time interval for an output of the sense amplifier to settle on the data value and the second sensing delay includes a second time interval for the output of the sense amplifier to settle on the data value.

21. The method of claim 18, wherein selecting the particular sensing delay comprises:

receiving a read delay value; and selecting the particular sensing delay based on the read delay value.

22. The method of claim 21, further comprising:

when the particular sensing delay corresponds to the first sensing delay, in response to error correction code (ECC) information associated with the at least one data value indicating an uncorrectable error, modifying the read delay value to indicate the second sensing delay.

23. The method of claim 21, wherein the read delay value is stored at the second memory array and corresponds to at least one particular memory cell to be read based on the read operation request.

24. The method of claim 23, further comprising:
upon powering on an electronic device that comprises the first memory array and the second memory array, transferring a plurality of read delay values from the first memory array to the second memory array, wherein the first memory array corresponds to a non-volatile memory device and the second memory array corresponds to a volatile memory device.

25. The method of claim 18, wherein selecting the particular sensing delay and sending the signal are initiated by a processor integrated into an electronic device.

26. An apparatus comprising:
first means for storing data comprising a first plurality of rows;
second means for storing data comprising a first plurality of rows, wherein each row of the second means for storing data corresponds to a respective row of the first means for storing data and includes a tag portion and a delay portion, the delay portion configured to store delay data corresponding to the respective row of the first means for storing data;
means for sensing at least one data value from a first row of the first plurality of rows of the first means for storing data; and
means for selecting between causing the means for sensing at least one data value to sense the at least one data value according to a first sensing delay or a second sensing delay based on the delay data stored in the delay portion of a first row of the second means for storing data that corresponds to the first row of the first means for storing data, wherein the second sensing delay is greater than the first sensing delay.

27. The apparatus of claim 26, integrated in at least one die.

28. The apparatus of claim 26, further comprising a device selected from a mobile phone, a tablet, a set top box, a music player, a video player, an entertainment unit, a navigation device, a communications device, a personal digital assistant (PDA), a fixed location data unit, and a computer, into which the first means for storing data, the means for sensing at least one data value, and the means for selecting are integrated.

29. A non-transitory computer readable medium storing instructions that, when executed by a processor, cause the processor to:
in response to a read operation request, initiate selecting a particular sensing delay from a first sensing delay or a second sensing delay, wherein the second sensing delay is greater than the first sensing delay; and
initiate sending a signal to a sense amplifier to cause the sense amplifier to sense at least one data value in a first row of a first memory array according to the particular sensing delay, the first memory array comprising a first plurality of rows,
wherein the particular sensing delay is selected based on delay data stored in a delay portion of a first row of a second memory array that corresponds to a first row of the first memory array, wherein the second memory array comprises a second plurality of rows, wherein each row of the second memory array corresponds to a respective row of the first memory array and includes a tag portion and the delay portion.

30. The non-transitory computer readable medium of claim 29, further comprising a device selected from a mobile phone, a tablet, a set top box, a music player, a video player, an entertainment unit, a navigation device, a communications device, a personal digital assistant (PDA), a fixed location data unit, and a computer, into which the non-transitory computer readable medium is integrated.

* * * * *